(12) United States Patent
Jun

(10) Patent No.: US 9,935,150 B2
(45) Date of Patent: Apr. 3, 2018

(54) X-RAY DETECTION PANEL OF X-RAY DETECTOR AND METHOD OF MANUFACTURING THE SAME

(71) Applicant: Seung Ik Jun, San Jose, CA (US)

(72) Inventor: Seung Ik Jun, San Jose, CA (US)

( * ) Notice: Subject to any disclaimer, the term of this patent is extended or adjusted under 35 U.S.C. 154(b) by 3 days.

(21) Appl. No.: 15/252,144

(22) Filed: Aug. 30, 2016

(65) Prior Publication Data

US 2018/0061884 A1 Mar. 1, 2018

(51) Int. Cl.
*H01L 27/146* (2006.01)

(52) U.S. Cl.
CPC .. *H01L 27/14658* (2013.01); *H01L 27/14612* (2013.01); *H01L 27/14627* (2013.01); *H01L 27/14689* (2013.01)

(58) Field of Classification Search
None
See application file for complete search history.

(56) References Cited

U.S. PATENT DOCUMENTS

| | | | | |
|---|---|---|---|---|
| 9,082,896 B2* | 7/2015 | Hynecek | ............ | H01L 27/14603 |
| 2005/0121708 A1* | 6/2005 | Hong | ................ | H01L 27/14609 |
| | | | | 257/292 |
| 2008/0042231 A1* | 2/2008 | Maes | ................ | H01L 27/14609 |
| | | | | 257/462 |
| 2012/0223215 A1* | 9/2012 | Lee | ................... | H01L 27/14609 |
| | | | | 250/208.1 |
| 2012/0231573 A1* | 9/2012 | Wu | ................... | H01L 27/14616 |
| | | | | 438/75 |

FOREIGN PATENT DOCUMENTS

| | | |
|---|---|---|
| JP | 2001-308306 A | 11/2001 |
| JP | 2001-345440 A | 12/2001 |
| JP | 2011-109694 A | 6/2011 |
| KR | 10-1628604 B1 | 6/2016 |
| KR | 10-2016-0107132 A | 9/2016 |

* cited by examiner

*Primary Examiner* — Ali Naraghi

(57) ABSTRACT

An X-ray detection panel for X-ray detectors and a method of manufacturing the same are disclosed. The X-ray detection panel includes a substrate, a photodiode disposed on the substrate and generating an electrical signal in response to light illuminating the photodiode, a first thin-film transistor disposed on the substrate and processing the electrical signal generated by the photodiode, and a second thin-film transistor disposed on the substrate and removing a residual current component accumulated in the photodiode and the first thin-film transistor. The X-ray detection panel can improve actual sensitivity and signal-to-noise ratio (SNR).

12 Claims, 24 Drawing Sheets

X-RAY DETECTION PANEL OF X-RAY DETECTOR AND METHOD OF MANUFACTURING THE SAME

TECHNICAL FIELD

Exemplary embodiments of the present disclosure relate to an X-ray detection panel for X-ray detectors and a method of manufacturing the same, and more particularly, to an X-ray detection panel for X-ray detectors, which can improve sensitivity and resolution of electrical signals output through excitation of a photodiode by visible light, and a method of manufacturing the same.

BACKGROUND

An X-ray detector is used to detect X-rays. Such an X-ray detector is classified into a direct type X-ray detector which directly converts X-rays into electronic signals and an indirect type X-ray detector which detects X-rays based on light in the visible range obtained through conversion of X-rays into visible light.

Embodiments of the present disclosure relate to an X-ray detection panel for an indirect type X-ray detector configured to detect X-rays through conversion of X-rays into visible light and a method of manufacturing the same. A typical indirect type X-ray detector includes a component for converting X-rays into light in the visible range, a component for converting the light in the visible range into electrical signals, and a component for converting the electrical signals into image signals.

In such an X-ray detector, an X-ray detection panel includes a number of image pixels for converting X-rays into electrical signals (for example, a detection panel having a size of 430 mm×430 mm includes about 9,000,000 pixels or more).

Each of these pixels is a passive pixel sensor and includes one thin-film transistor and one photodiode. The photodiode is excited to generate signals and the thin-film transistor processes the signals generated by the photodiode as electrical signals. Here, each of the thin-film transistor and the photodiode has a residual current component called leakage current therein, thereby making it difficult to reduce density of states into a complete ground state. As a result, signals output from the X-ray detection panel have low sensitivity and high noise, and can cause image lag and ghost. Accordingly, there is difficulty realizing low dose applications and video images of the X-ray detector due to low signal-to-noise ratio (SNR), high image lag, and ghost.

One example of the background technique is disclosed in Korean Patent Registration No. 10-1628604 (2016.06.01).

SUMMARY

Exemplary embodiments of the present disclosure provide an X-ray detection panel for X-ray detectors, which can provide a high quality image by improving signal-to-noise ratio while reducing image lag and ghost, and a method of manufacturing the same.

In accordance with one aspect of the present disclosure, an X-ray detection panel for X-ray detectors includes: a substrate; a photodiode disposed on the substrate and generating an electrical signal in response to light illuminating the photodiode; a first thin-film transistor disposed on the substrate and processing the electrical signal generated by the photodiode; and a second thin-film transistor disposed on the substrate and removing a residual current component accumulated in the photodiode and the first thin-film transistor.

The X-ray detection panel may further include a gate line, a gate reset line and a data line formed on the substrate, wherein each of the first and second thin-film transistors may be electrically connected to at least one of the gate line, the gate reset line and the data line.

The first thin-film transistor may include a gate electrode, a source electrode and a drain electrode, in which the drain electrode of the first thin-film transistor may be connected to the data line and the gate electrode of the first thin-film transistor may be connected to the gate line.

The second thin-film transistor may include a gate electrode, a source electrode and a drain electrode, in which the gate electrode of the second thin-film transistor may be connected to the gate reset line.

The X-ray detection panel may further include a bias line, wherein the photodiode may be connected at one side thereof to the source electrode of the first thin-film transistor and at the other side thereof to the bias line.

Each of the first and second thin-film transistors may include a gate electrode, a source electrode and a drain electrode, and the source electrode of the first thin-film transistor may be connected to the drain electrode of the second thin-film transistor and the photodiode.

The second thin-film transistor may include a gate electrode, a source electrode and a drain electrode, and the source electrode of the second thin-film transistor may be connected to a VDD line.

The X-ray detection panel may further include a third thin-film transistor amplifying an output of the photodiode.

The X-ray detection panel may further include a gate line, a gate reset line and a data line formed on the substrate, and the third thin-film transistor may be electrically connected to at least one of the gate line, the gate reset line and the data line.

Each of the first and third thin-film transistors may include a gate electrode, a source electrode and a drain electrode, and the gate electrode of the third thin-film transistor may be connected to one side of the photodiode and the source electrode of the first thin-film transistor.

The second thin-film transistor may include a gate electrode, a source electrode and a drain electrode, the drain electrode of the third thin-film transistor may be connected to the source electrode of the first thin-film transistor, and the source electrode of the third thin-film transistor may be connected to the drain electrode of the second thin-film transistor and a $V_{DD}$ line.

The photodiode may further include a microlens formed thereon.

The X-ray detection panel may further include a transparent electrode disposed on the photodiode, wherein the microlens may be disposed on the transparent electrode.

The X-ray detection panel may further include a lower electrode disposed under the photodiode and electrically connected to at least one of the first and second thin-film transistors.

In accordance with another aspect of the present disclosure, a method of manufacturing an X-ray detection panel for X-ray detectors includes: forming first and second gate electrodes on a substrate; forming a first insulation layer to cover the first and second gate electrodes; forming first and second semiconductor active layers on the first insulation layer; forming a drain electrode, a connection electrode, and a source electrode on the first and second semiconductor active layers; forming a second insulation layer including a first via-hole on the drain electrode, the connection electrode, and the source electrode; forming a lower electrode, a photodiode and a transparent electrode on the second insulation layer to be electrically connected to the connection electrode through the first via-hole; forming a third insulation layer including second and third via-holes on the transparent electrode; and forming a data line electrically connected to the drain electrode through the second via-hole and a bias line electrically connected to the transparent electrode through the third via-hole.

The connection electrode may electrically connect the first and second semiconductor active layers to each other.

The drain electrode may be electrically connected to the first semiconductor active layer, and the source electrode may be electrically connected to the second semiconductor active layer.

In accordance with a further aspect of the present disclosure, a method of manufacturing an X-ray detection panel for X-ray detectors includes: forming first to third gate electrodes on a substrate; forming a first insulation layer to cover the first to third gate electrodes; forming first to third semiconductor active layers on the first insulation layer; forming a first via-hole in the first insulation layer so as to expose part of the third gate electrode; forming a drain electrode, a first connection electrode, a second connection electrode, and a source electrode on the first to third semiconductor active layers; forming a second insulation layer including a second via-hole on the drain electrode, the first connection electrode, the second connection electrode, and the source electrode; forming a lower electrode on the second insulation layer to be electrically connected to the second connection electrode through the second via-hole; forming a photodiode and a transparent electrode on the lower electrode; forming a third insulation layer including third and fourth via-holes on the transparent electrode; and forming a data line electrically connected to the drain electrode through the third via-hole and a bias line electrically connected to the transparent electrode through the fourth via-hole, wherein the second connection electrode may be electrically connected to the third gate electrode through the first via-hole.

The drain electrode may be electrically connected to the first semiconductor active layer, and the source electrode may be electrically connected to the second semiconductor active layer and the third semiconductor active layer.

The first connection electrode may electrically connect the first and third semiconductor active layers to each other, and the second connection electrode may electrically connect the third gate electrode and the second semiconductor active layer to each other.

According to some exemplary embodiments of the present disclosure, the X-ray detection panel for X-ray detectors may employ two thin-film transistors such that one thin-film transistor processes electrical signals generated through excitation of visible light by a photodiode, and the other thin-film transistor removes residual current components accumulated in the one thin-film transistor and the photodiode, thereby improving actual sensitivity and signal-to-noise ratio (SNR). With this structure, the X-ray detection panel for X-ray detectors can output images with high quality.

According to some exemplary embodiments of the present disclosure, the X-ray detection panel for X-ray detectors may employ three thin-film transistors such that a third thin-film transistor amplifies electric current related to brightness of light output from the photodiode, thereby improving quality of images output from the X-ray detection panel.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION

Hereinafter, exemplary embodiments of the present disclosure will be described in detail with reference to the accompanying drawings.

Figure 1:
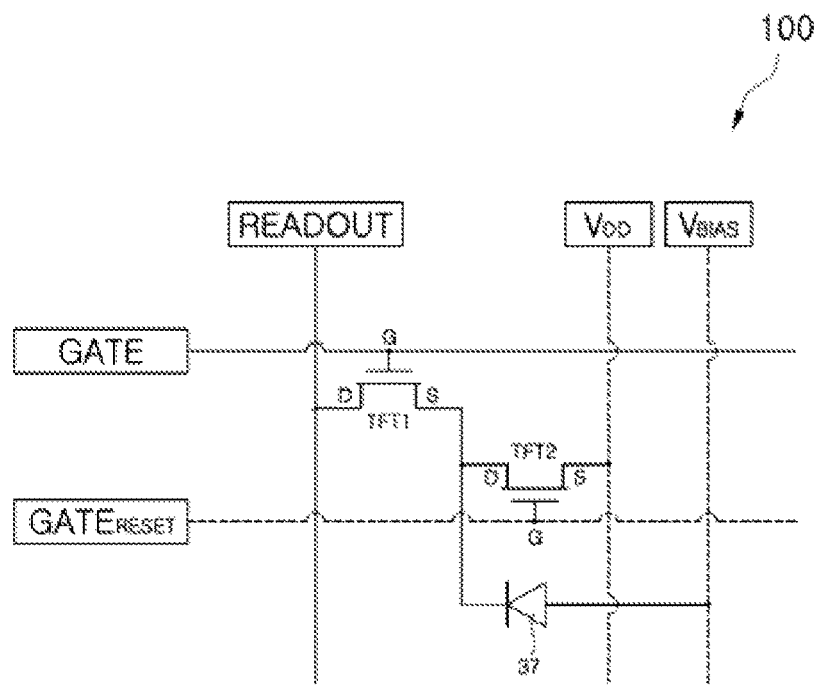
FIG. 1 is a circuit diagram of an active pixel sensor according to one exemplary embodiment of the present disclosure.

FIG. 1 is a circuit diagram of an active pixel sensor according to one exemplary embodiment of the present disclosure.

Figure 2:
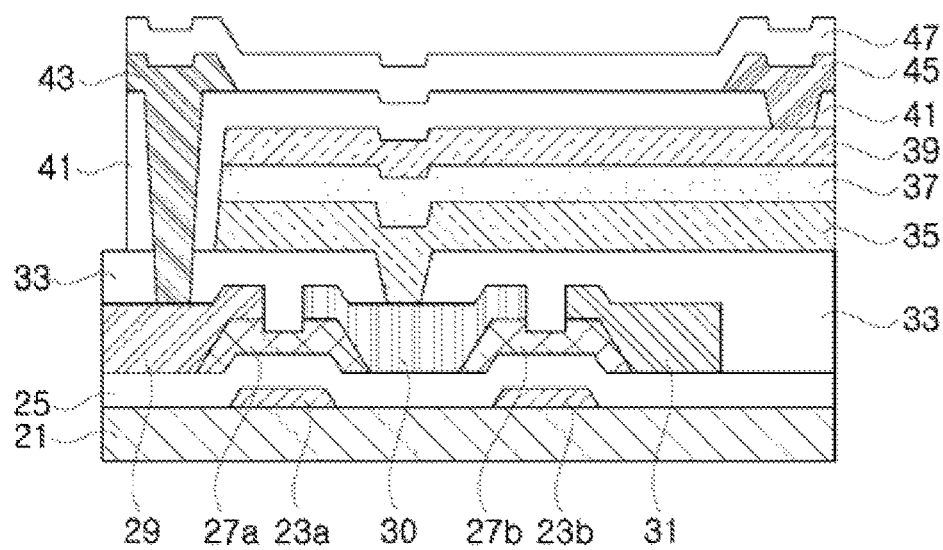
FIG. 2 is a sectional view of the active pixel sensor according to the exemplary embodiment of the present disclosure.

Referring to FIG. 1, an active pixel sensor 100 according to one exemplary embodiment of the present disclosure will now be described. The active pixel sensor 100 is included in an X-ray detection panel of an X-ray detector, particularly, in an image pixel of the X-ray detection panel. One active pixel sensor 100 shown in FIG. 1 and FIG. 2 is disposed in one image pixel and can output signals after detecting X-rays.

In this exemplary embodiment, one active pixel sensor 100 includes first and second thin-film transistors TFT1, TFT2. The first thin-film transistor TFT1 processes a signal output from a photodiode 37 excited by visible light. The second thin-film transistor TFT2 removes residual current components accumulated in the first thin-film transistor TFT1 and the photodiode 37.

To this end, the first thin-film transistor TFT1 processes an output of the corresponding pixel. Here, a source terminal of the first thin-film transistor TFT1 may be connected to a drain terminal of the second thin-film transistor TFT2, and a drain terminal of the first thin-film transistor TFT1 may be connected to a readout element through a data line 43. In addition, a gate terminal of the first thin-film transistor TFT1 may be connected to a gate line.

The second thin-film transistor TFT2 serves to reduce density of states into a complete ground state by removing residual current components accumulated in the first thin-film transistor TFT1 and the photodiode 37, thereby improving actual sensitivity and signal-to-noise ratio. To this end, a source terminal of the second thin-film transistor TFT2 is connected to a $V_{DD}$ line and the drain terminal of the second thin-film transistor TFT2 is connected to both the photodiode 37 and the source terminal of the first thin-film transistor TFT1. In addition, a gate terminal of the second thin-film transistor TFT2 may be connected to a gate reset line.

As described above, the photodiode 37 may be connected at one side thereof to the drain terminal of the second thin-film transistor TFT2 and at the other side thereof to a bias line 45.

FIG. 2 is a sectional view of the active pixel sensor according to the exemplary embodiment of the present disclosure, and FIG. 3 to FIG. 12 are views illustrating a method of manufacturing the active pixel sensor according to the exemplary embodiment of the present disclosure.

Referring to FIG. 3 to FIG. 12, the configuration of the active pixel sensor 100 and a method of manufacturing the active pixel sensor 100 will be described together with reference to FIG. 2.

The active pixel sensor 100 includes a substrate 21, a first gate electrode 23a, a second gate electrode 23b, a first insulation layer 25, a first semiconductor active layer 27a, a second semiconductor active layer 27b, a drain electrode 29, a connection electrode 30, a source electrode 31, a second insulation layer 33, a lower electrode 35, a photodiode 37, a transparent electrode 39, a third insulation layer 41, a data line 43, a bias line 45, and a protective layer 47.

Figure 3:
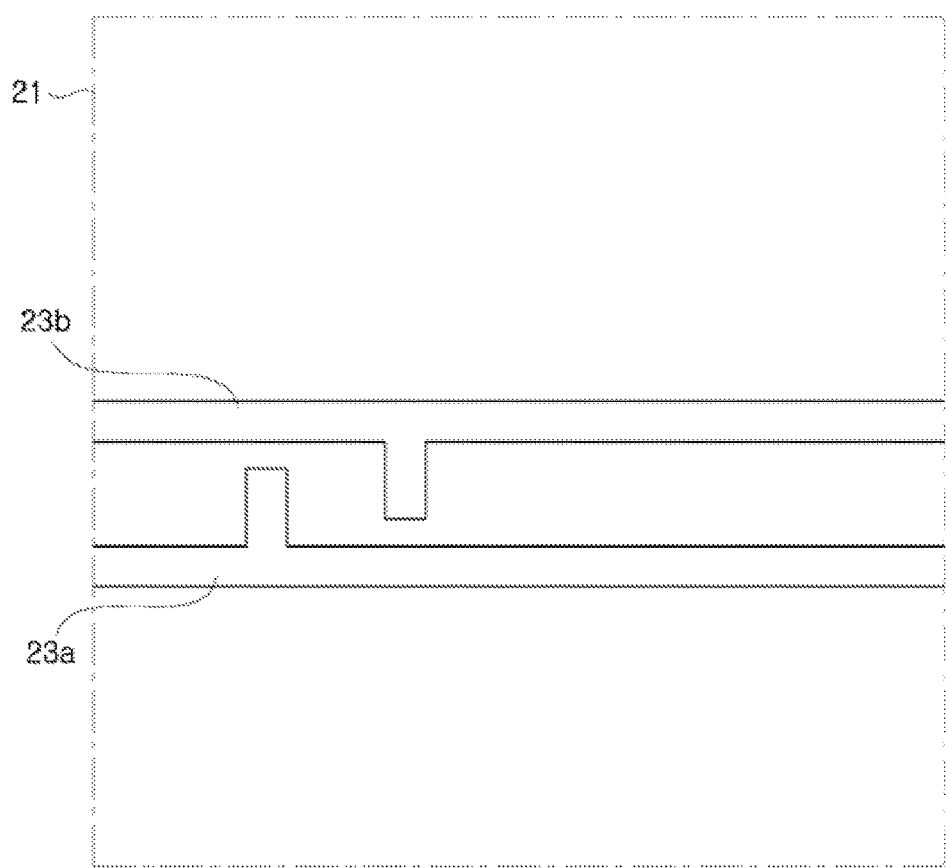
FIG. 3 to FIG. 12 are views illustrating a method of manufacturing an active pixel sensor according to one exemplary embodiment of the present disclosure.

Referring to FIG. 2 and FIG. 3, the substrate 21 is disposed at a lower side of the active pixel sensor and each component of the active pixel sensor may be stacked on the substrate 21. As shown in FIG. 3, first, the first and second gate electrodes 23a, 23b are disposed on the substrate 21. The first and second gate electrodes 23a, 23b may be disposed to traverse the substrate 21 in a state of being separated from each other. The first gate electrode 23a is elongated in the longitudinal direction of the substrate and may have a protrusion protruding in the perpendicular direction with respect to the longitudinal direction. Here, the protrusion of the first gate electrode 23a may be formed towards the second gate electrode 23b.

The second gate electrode 23b is also elongated in the longitudinal direction of the substrate and may have a protrusion protruding in the perpendicular direction with respect to the longitudinal direction. The protrusion of the second gate electrode 23b may be formed towards the first gate electrode 23a. Here, the protrusion of the first gate electrode 23a and the protrusion of the second gate electrode 23b may be separated a predetermined distance or more from each other.

Each of the first and second gate electrodes 23a, 23b may include at least one of Al, Al—Nd, Al—Cu, Mo, Ti, Ta, Cr, and alloys thereof, and may be composed of a single layer or multiple layers.

The first gate electrode 23a extends to the gate line and the second gate electrode 23b extends to the gate reset line.

The first insulation layer 25 may be formed to cover upper sides of the first and second gate electrodes 23a, 23b. As shown in FIG. 2, the first insulation layer 25 may be formed to cover the entirety of the substrate 21 together with the first and second gate electrodes 23a, 23b. The first insulation layer 25 electrically insulates the first and second gate electrodes 23a, 23b from other electrodes and may include $SiO_2$ and the like.

Figure 4:
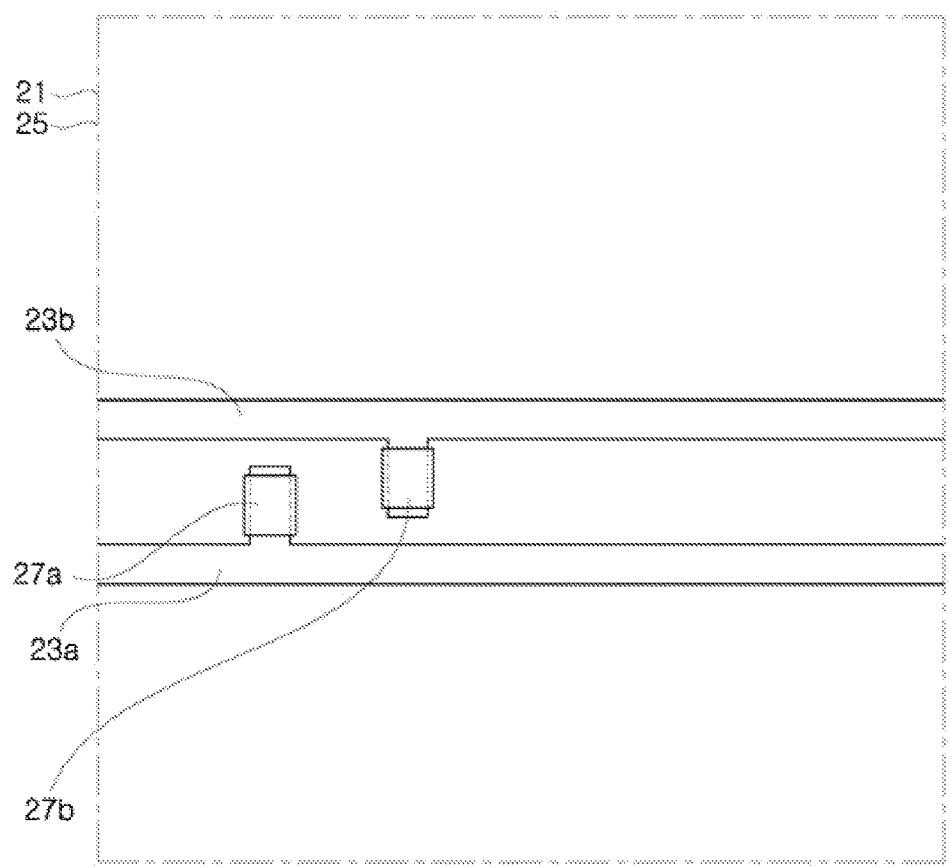

After the first insulation layer 25 is formed to cover the upper sides of the first and second gate electrodes 23a, 23b, the first and second semiconductor active layers 27a, 27b are formed on the first insulation layer 25. As shown in FIG. 4, the first and second semiconductor active layers 27a, 27b may be simultaneously disposed on the first and second gate electrodes 23a, 23b on the first insulation layer 25, respectively. It is not necessary for each of the first and second semiconductor active layers 27a, 27b to overlap the entirety of each of the first and second gate electrodes 23a, 23b, and the first and second semiconductor active layers 27a, 27b may be disposed to partially overlap the first and second gate electrodes 23a, 23b, as shown in FIG. 4.

In this exemplary embodiment, each of the first and second semiconductor active layers 27a, 27b may include at least one of amorphous silicon, low temperature polycrystalline silicon, and oxide semiconductors. The oxide semiconductor may be an oxide of at least one of In, Ga and Zn. In addition, the first and second semiconductor active layers 27a, 27b may be formed by, for example, deposition of a material for the first and second semiconductor active layers 27a, 27b on the first insulation layer 25, followed by patterning.

Figure 5:
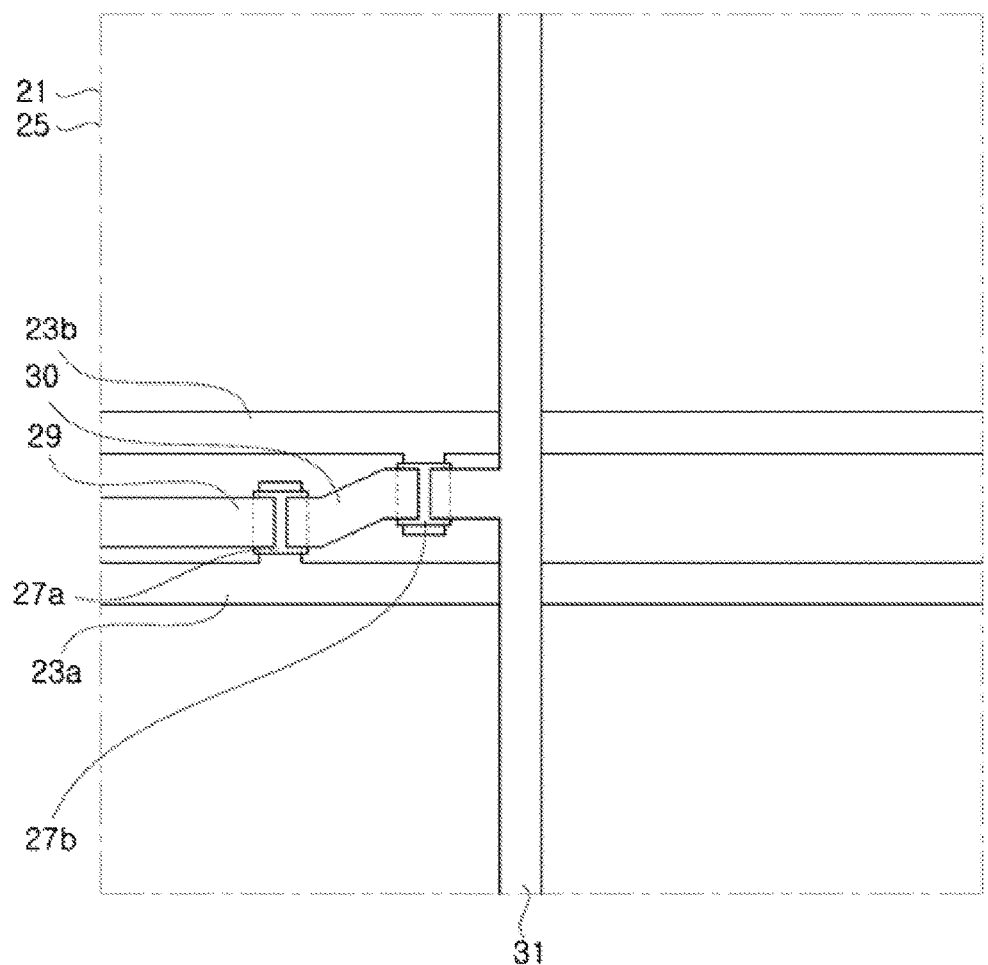

Furthermore, as shown in FIG. 5, the drain electrode 29, the connection electrode 30 and the source electrode 31 are formed to cover the first and second semiconductor active layers 27a, 27b. The drain electrode 29, the connection electrode 30 and the source electrode 31 may include the same material and may be electrically connected to the first and second semiconductor active layers 27a, 27b, respectively. That is, the drain electrode 29 is disposed to cover part of the first semiconductor active layer 27a and the source electrode 31 is disposed to cover part of the second semiconductor active layer 27b. In addition, the connection electrode 30 may be disposed to cover part of the first semiconductor active layer 27a and part of the second semiconductor active layer 27b.

Here, the drain electrode 29, the connection electrode 30 and the source electrode 31 may be formed using one electrode member. Namely, the electrode member is formed in the perpendicular direction with respect to the first and second gate electrodes 23a, 23b and then extends in the perpendicular direction with respect to the longitudinal direction of the electrode member so as to cover the first and second semiconductor active layers 27a, 27b. Then, the electrode member is divided into the drain electrode 29, the connection electrode 30 and the source electrode 31 by etching the electrode member disposed on the first and second semiconductor active layers 27a, 27b. As a result, the drain electrode 29, the connection electrode 30 and the source electrode 31 can be electrically insulated from each other. As such, since the drain electrode 29, the connection electrode 30 and the source electrode 31 are formed by etching, grooves can be formed on the first and second semiconductor active layers 27a, 27b.

Each of the drain electrode 29, the connection electrode 30 and the source electrode 31 may be formed of at least one of Al, Al—Nd, Al—Cu, Mo, Ti, Ta, Cr, and alloys thereof and may be composed of a single layer or multiple layers. Here, the source electrode 31 may extend to the $V_{DD}$ line.

Figure 6:
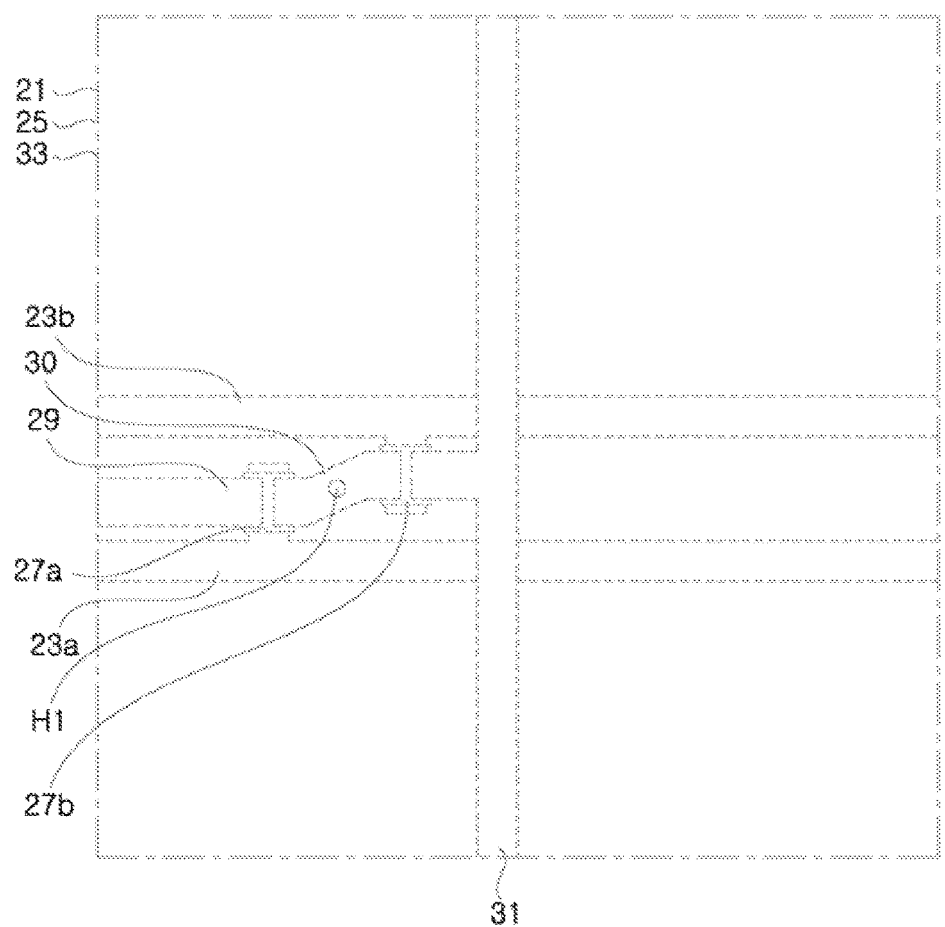

As such, after formation of the drain electrode 29, the connection electrode 30 and the source electrode 31, the second insulation layer 33 may be formed to cover the drain electrode 29, the connection electrode 30 and the source electrode 31, as shown in FIG. 2 and FIG. 6. The second insulation layer 33 may have the same or smaller size than the first insulation layer 25 and may include the same material as the first insulation layer 25. The second insulation layer 33 may be formed to cover the entirety of the substrate 21.

Furthermore, as shown in FIG. 6, a first via-hole H1 may be formed in the second insulation layer 33. The first via-hole H1 is disposed on the connection electrode 30 such that part of the connection electrode 30 can be exposed through the first via-hole H1.

Figure 7:
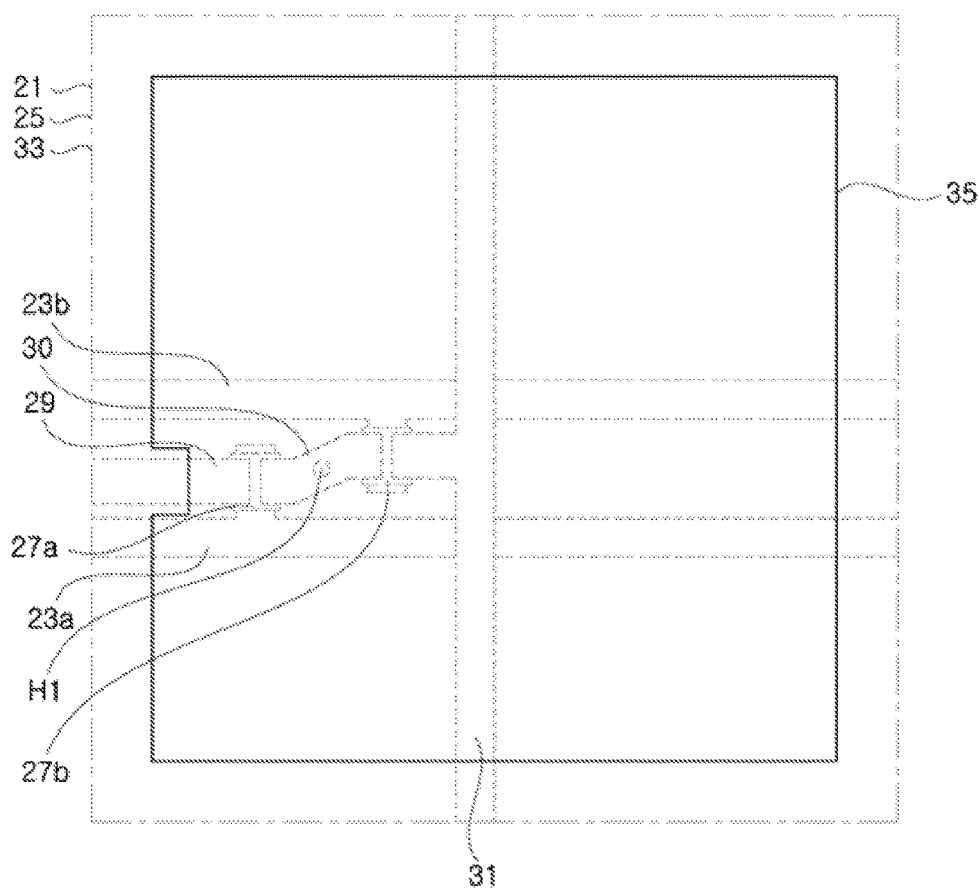

Referring to FIG. 7, the lower electrode 35 is formed on the second insulation layer 33 including the first via-hole H1. The lower electrode 35 is formed on the second insulation layer 33 while filling the first via-hole H1 and is electrically connected to the connection electrode 30 through the first via-hole H1. In addition, the lower electrode 35 may be formed with a groove at a location thereof corresponding to the drain electrode 29. In this structure, the second insulation layer 33 may be exposed through the groove formed on the lower electrode 35. The groove is required for the subsequent process, which will be described below.

The lower electrode 35 may be formed of at least one selected from the group consisting of Au, Ag, Al, Al—Nd, Al—Cu, Mo, Ti, Ta, Cr, and alloys thereof, and may be composed of a single layer or multiple layers.

Figure 8:
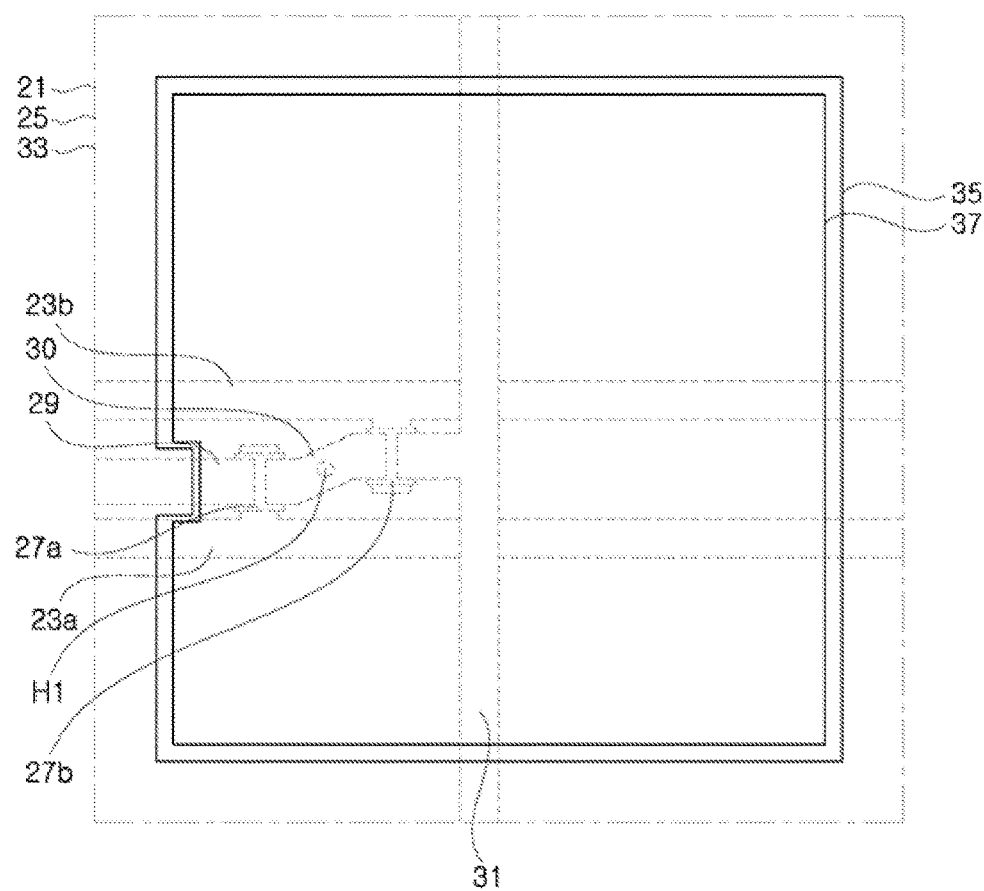

After the lower electrode 35 is formed, the photodiode 37 may be formed on the lower electrode 35, as shown in FIG. 8. The photodiode 37 may be formed to cover the entirety of the lower electrode 35. As in the lower electrode 35, the photodiode 37 may be formed with a groove at a location thereof corresponding to the drain electrode 29 and the groove of the photodiode 37 may have the same or smaller size than the groove of the lower electrode 35.

The photodiode 37 may be a PIN diode, an avalanche photodiode (APD), or the like and can generate electrical signals by light irradiating the photodiode.

Figure 9:
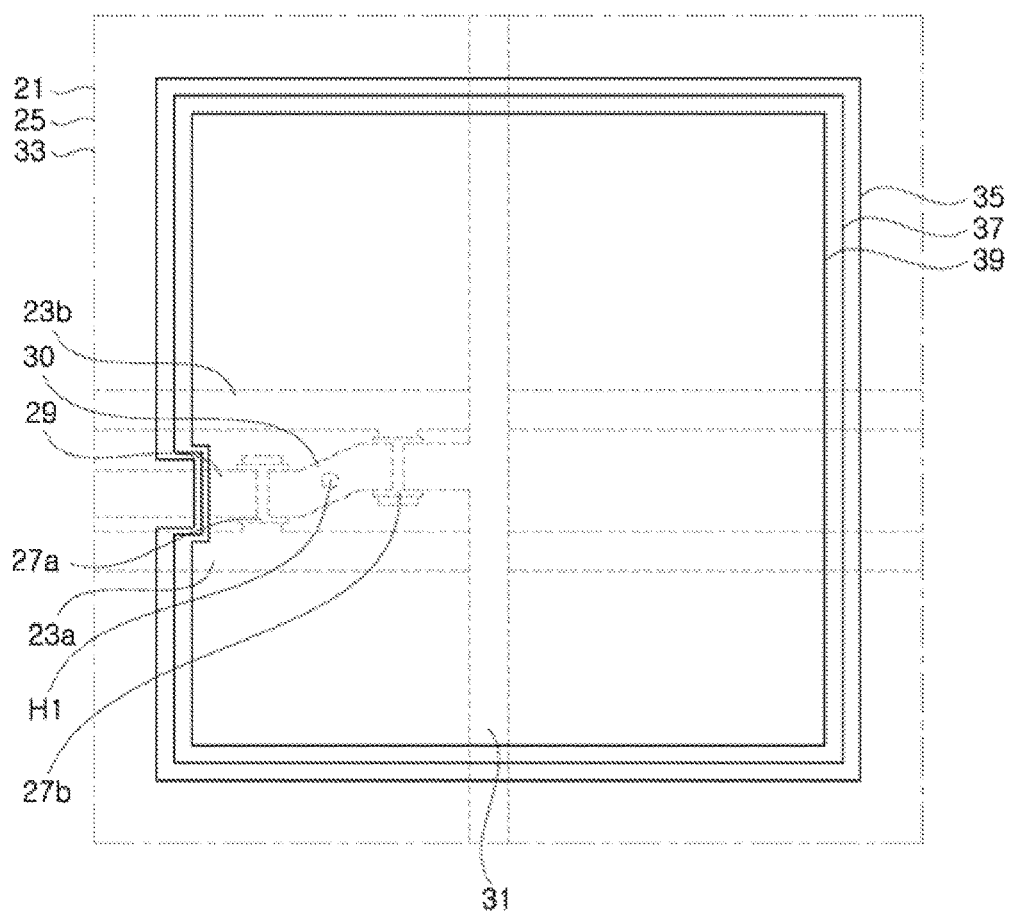

Then, as shown in FIG. 9, the transparent electrode 39 is formed on the photodiode 37. As in the lower electrode 35 and the photodiode 37, the transparent electrode 39 may be formed with a groove at a location corresponding to the drain electrode 29, and the groove of the transparent electrode 39 may have the same or smaller size than the groove of the photodiode 37.

Each of the lower electrode 35 and the transparent electrode 39 may be formed through vacuum deposition, photolithography, wet etching, or dry etching.

Figure 10:
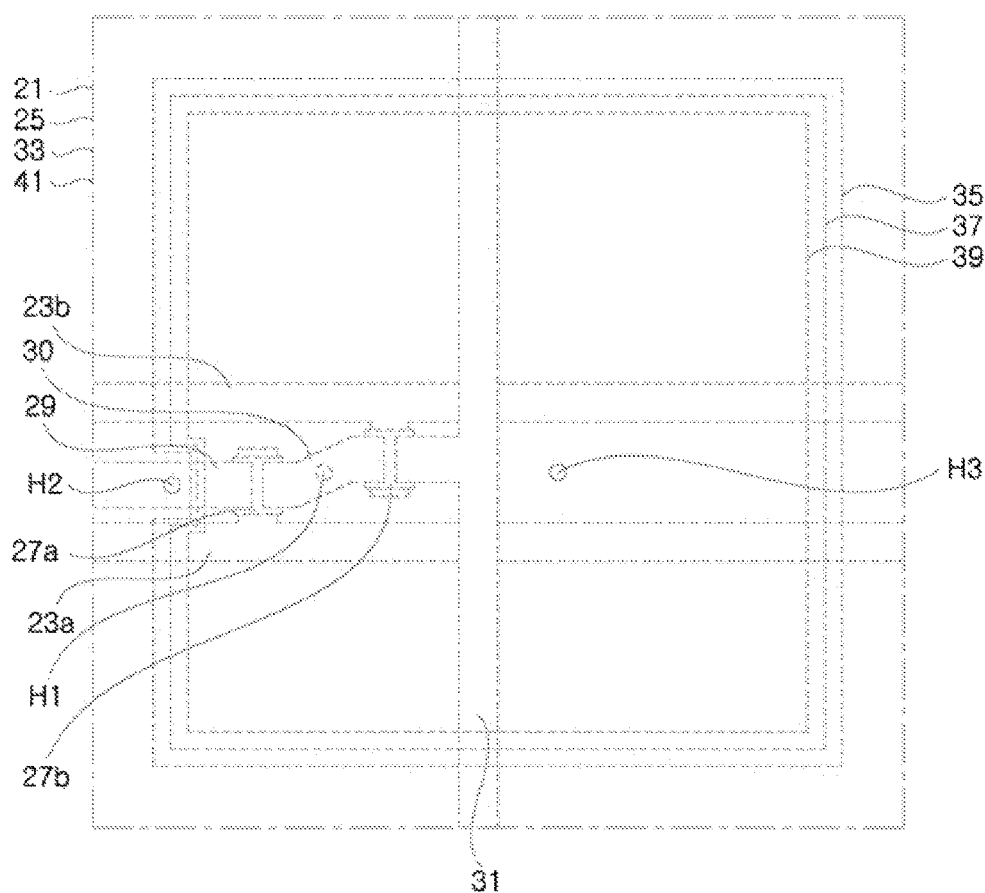

The third insulation layer 41 may be formed on the transparent electrode 39. The third insulation layer 41 may be formed to cover the entirety of the photodiode 37 and the lower electrode 35 together with the transparent electrode 39, or may be formed to cover the entirety of the substrate 21, as shown in FIG. 10. Further, the third insulation layer 41 may include the same material as the other insulation layers. Here, the third insulation layer 41 may be formed to fill the grooves formed on the lower electrode 35, the photodiode 37 and the transparent electrode 39, respectively. As a result, the third insulation layer 41 may contact part of the second insulation layer 33 exposed through the grooves, as shown in FIG. 2.

After formation of the third insulation layer 41, second and third via-holes H2, H3 may be formed therein. The second via-hole H2 may be formed through the second and third insulation layers 33, 41 to expose part of the drain electrode 29 formed under the second insulation layer 33, and the third via-hole H3 may be formed through the third insulation layer 41 to expose part of the lower electrode 39.

As shown in FIG. 10, the third via-hole H3 may be formed at a location separated from the source electrode 31 by a predetermined distance.

Figure 11:
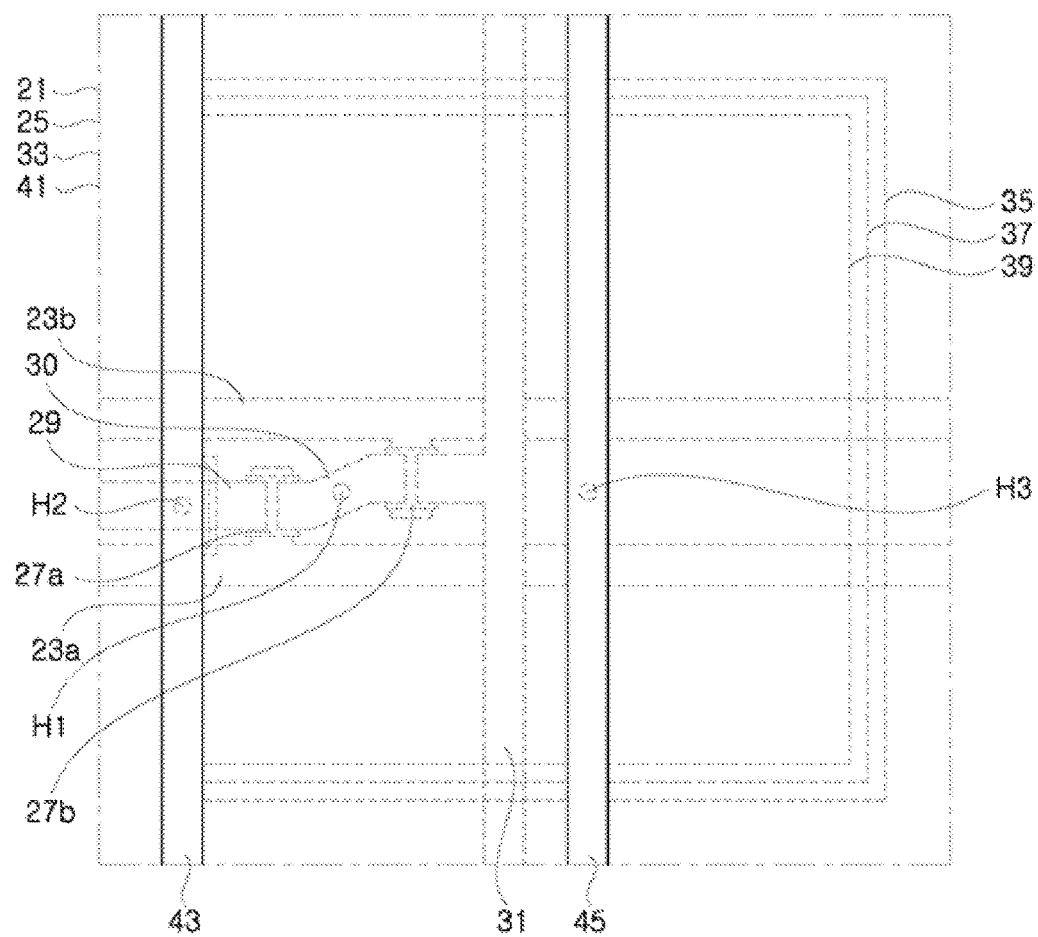

As shown in FIG. 11, the data line 43 passing the second via-hole H2 and the bias line 45 passing the third via-hole H3 may be formed. Each of the data line 43 and the bias line 45 may be formed parallel to the $V_{DD}$ line of the source electrode 31.

The data line 43 may be formed to fill the second via-hole H2 while passing through the second via-hole H2, whereby the drain electrode 29 exposed through the second via-hole H2 can be electrically connected to the data line 43.

The bias line 45 may be formed to fill the third via-hole H3 while passing the third via-hole H3, whereby the transparent electrode 39 exposed through the third via-hole H3 can be electrically connected to the bias line 45.

Figure 12:
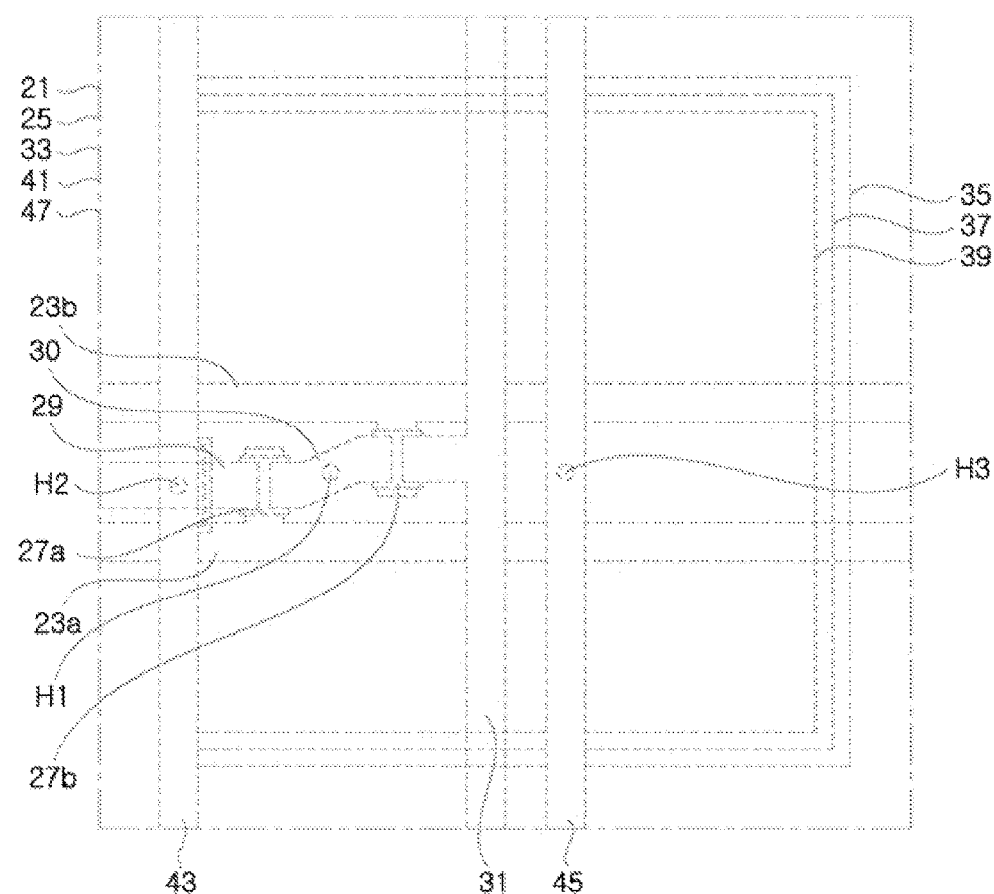

After formation of the data line 43 and the bias line 45, the protective layer 47 is formed on the data line 43 and the bias line 45 so as to cover the data line 43 and the bias line 45. Alternatively, as shown in FIG. 12, the protective layer 47 may be formed to cover the entirety of the substrate 21 as well as the data line 43 and the bias line 45. The protective layer 47 may include the same material as the first to third insulation layers 25, 33, 41.

Through the processes as described above, the active pixel sensor 100 can be manufactured as shown in FIG. 12.

Figure 13:
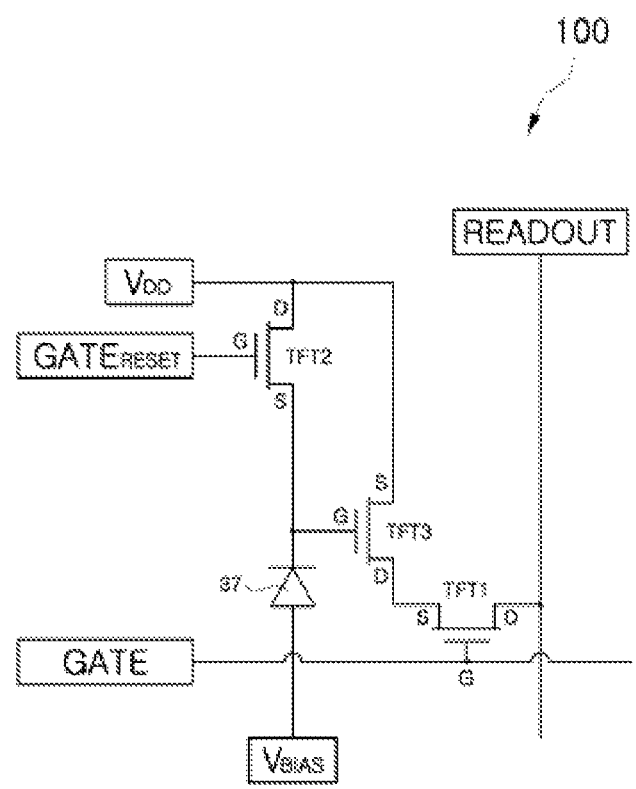
FIG. 13 is a circuit diagram of an active pixel sensor according to another exemplary embodiment of the present disclosure.

FIG. 13 is a circuit diagram of an active pixel sensor according to another exemplary embodiment of the present disclosure.

Referring to FIG. 13, an active pixel sensor 100 according to this exemplary embodiment includes three thin-film transistors. In this exemplary embodiment, a first thin-film transistor TFT1 processes signals output from a photodiode 37 excited by visible light. A second thin-film transistor TFT2 serves to remove residual current components accumulated in the first thin-film transistor TFT1 and the photodiode 37, and a third thin-film transistor TFT3 serves to amplify signals regarding darkness and brightness of light emitted from the photodiode 37.

To this end, the first thin-film transistor TFT1 processes an output of the corresponding pixel. Here, a source terminal of the first thin-film transistor TFT1 may be connected to a drain terminal of the third thin-film transistor TFT3, and a drain terminal of the first thin-film transistor TFT1 may be connected to a readout element through the data line 43. In addition, a gate terminal of the first thin-film transistor TFT1 may be connected to a gate line.

The second thin-film transistor TFT2 serves to reduce density of states into a complete ground state by removing residual current components accumulated in the first thin-film transistor TFT1 and the photodiode 37, thereby improving actual sensitivity and signal-to-noise ratio. To this end, a source terminal of the second thin-film transistor TFT2 is connected to both the photodiode 37 and a gate terminal of the third thin-film transistor TFT3, and a drain terminal of the second thin-film transistor TFT2 is connected a $V_{DD}$ line. In addition, a gate terminal of the second thin-film transistor TFT2 may be connected to a gate reset line.

In addition, the third thin-film transistor TFT3 serves to amplify signals regarding darkness and brightness of light emitted from the photodiode 37, and to transfer the amplified signals to the first thin-film transistor TFT1. To this end, a source terminal of the third thin-film transistor TFT3 may be connected to both the $V_{DD}$ line and the drain terminal of the first thin-film transistor TFT1, and the drain terminal of the third thin-film transistor TFT3 may be connected to the source terminal of the first thin-film transistor TFT1. In addition, a gate terminal of the third thin-film transistor TFT3 may be connected to both the photodiode 37 and the source terminal of the second thin-film transistor TFT2.

FIG. 14 to FIG. 24 are views illustrating a method of manufacturing the active pixel sensor according to the other exemplary embodiment of the present disclosure.

Referring to FIG. 14 to FIG. 24, the configuration of the active pixel sensor 100 and a method of manufacturing the active pixel sensor 100 will be described together with FIG. 13.

The active pixel sensor 100 includes a substrate 21, a first gate electrode 23a, a second gate electrode 23b, a first insulation layer 25, a first semiconductor active layer 27a, a second semiconductor active layer 27b, a drain electrode 29, a connection electrode 30, a source electrode 31, a second insulation layer 33, a lower electrode 35, a photodiode 37, a transparent electrode 39, a third insulation layer 41, a data line 43, a bias line 45, and a protective layer 47.

Figure 14:
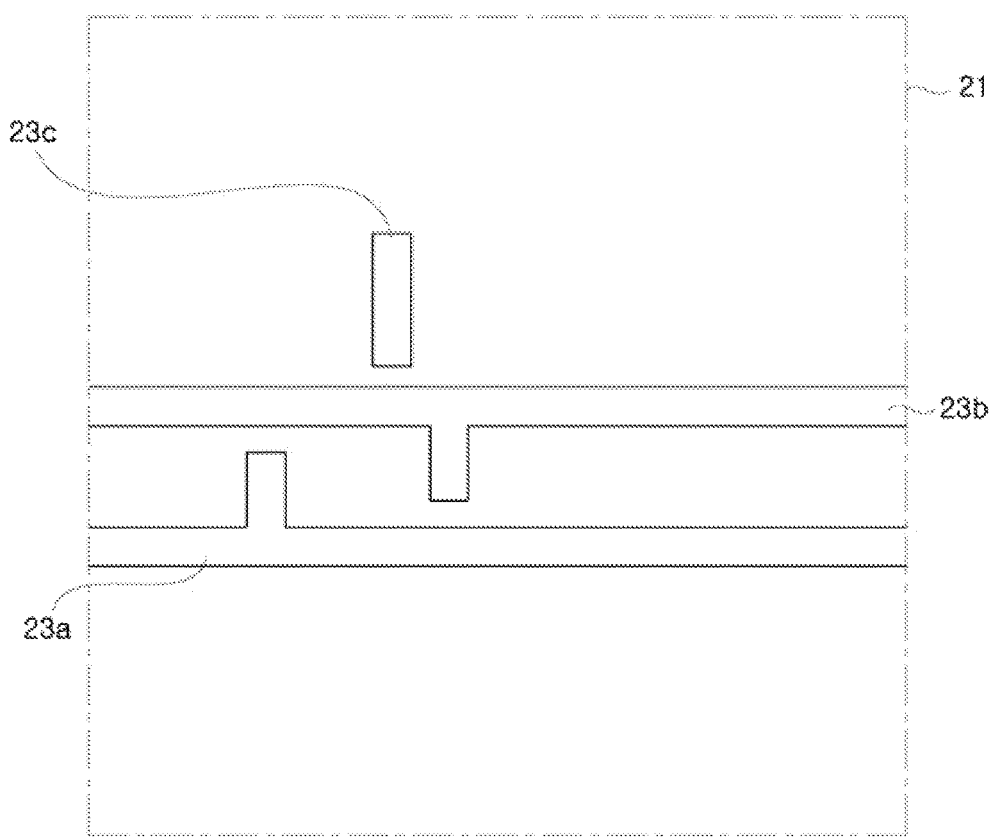
FIG. 14 to FIG. 24 are views illustrating a method of manufacturing an active pixel sensor according to another exemplary embodiment of the present disclosure.

Referring to FIG. 14, the substrate 21 is disposed at a lower side of the active pixel sensor and each of components of the active pixel sensor may be stacked on the substrate 21. The first to third gate electrodes 23a, 23b, 23c are disposed on the substrate 21. The first and second gate electrodes 23a, 23b are the same as those of the active pixel sensor according to the above exemplary embodiment, and the third gate electrode 23c may be disposed at a side of the second gate electrode 23b on which the first gate electrode 23a is not formed, that is, at a side of the second gate electrode 23b opposite the first gate electrode 23a. Here, the third gate electrode 23c may be formed to have a length in one direction and may be disposed to be separated from the first and second gate electrodes 23a, 23b by a predetermined distance.

Each of the first to third gate electrodes 23a, 23b, 23c may include at least one of Al, Al—Nd, Al—Cu, Mo, Ti, Ta, Cr and alloys thereof, and may be composed of a single layer or multiple layers.

The first insulation layer 25 may be formed to cover upper sides of the first to third gate electrodes 23a, 23b, 23c. The first insulation layer 25 may be formed to cover the entirety of the substrate 21 together with the first to third gate electrodes 23a, 23b, 23c. The first insulation layer 25 electrically insulates the first to third gate electrodes 23a, 23b, 23c from other electrodes, and may include $SiO_2$ and the like.

Figure 15:
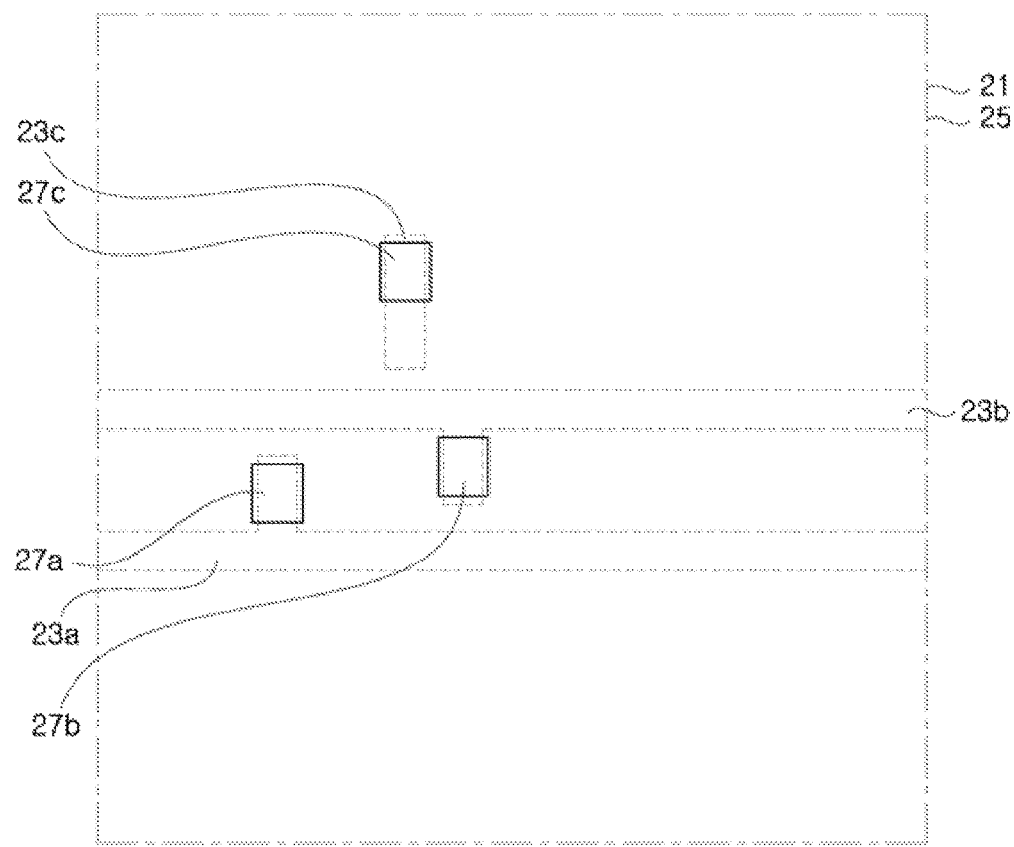

After the first insulation layer 25 is formed to cover the first to third gate electrodes 23a, 23b, 23c, the first to third semiconductor active layers 27a, 27b, 27c are formed on the first insulation layer 25, as shown in FIG. 15. The first to third semiconductor active layers 27a, 27b, 27c may be simultaneously disposed on the first to third gate electrodes 23a, 23b, 23c on the first insulation layer 25, respectively. Specifically, the first semiconductor active layer 27a may be disposed on the first gate electrode 23a, the second semiconductor active layer 27b may be disposed on the second gate electrode 23b, and the third semiconductor active layer 27c may be disposed on the third gate electrode 23c.

In this exemplary embodiment, it is not necessary for each of the first to third semiconductor active layers 27a, 27b, 27c to overlap the entirety of each of the first to third gate electrodes 23a, 23b, 23c, and the first to third semiconductor active layers 27a, 27b, 27c may be disposed to partially overlap the first to third gate electrodes 23a, 23b, 23c, respectively.

As in the above exemplary embodiment, each of the first to third semiconductor active layers 27a, 27b, 27c may include at least one of amorphous silicon, low temperature polycrystalline silicon, and oxide semiconductors. The oxide semiconductor may be an oxide of at least one of In, Ga and Zn.

Figure 16:
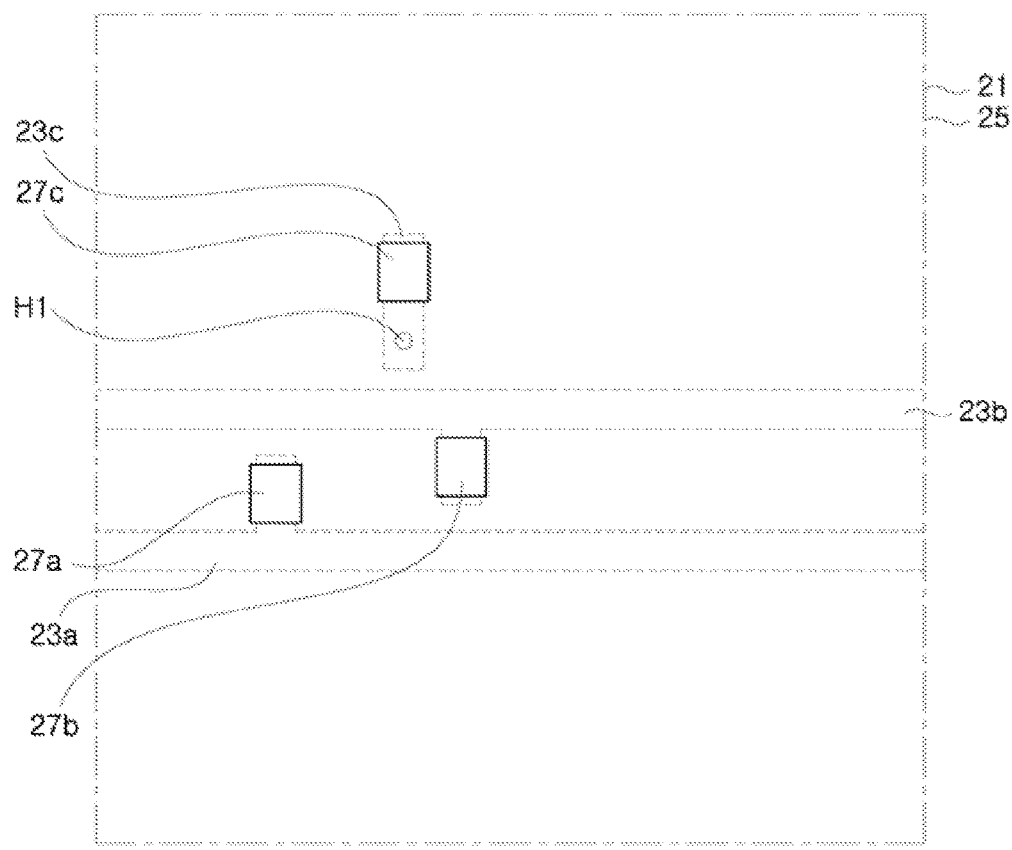

Furthermore, as shown in FIG. 16, after formation of the first to third semiconductor active layers 27a, 27b, 27c, a first via-hole H1 may be formed in the first insulation layer 25 on the third gate electrode 23c not covered by the third semiconductor active layer 27c.

The first via-hole H1 may be disposed on the third gate electrode 23c such that part of the third gate electrode 23c can be exposed through the first via-hole H1. With this structure, the first via-hole H1 can expose part of the third gate electrode 23c.

Figure 17:
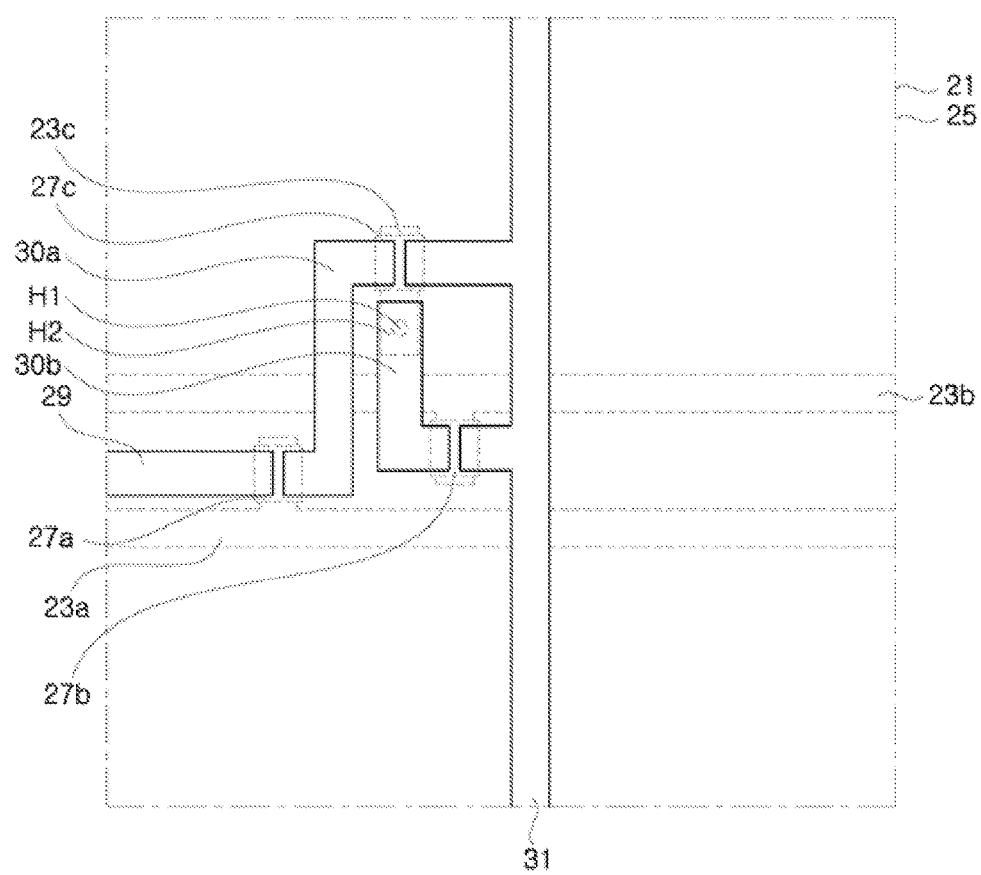

Referring to FIG. 17, the drain electrode 29, the first connection electrode 30a, the second connection electrode 30b, and the source electrode 31 are formed on the second insulation layer 33. The drain electrode 29, the first connection electrode 30a, the second connection electrode 30b, and the source electrode 31 include the same material and may be electrically connected to the first to third semiconductor active layers 27a, 27b, 27c, respectively.

That is, the drain electrode 29 and the first connection electrode 30a are electrically connected to the first semiconductor active layer 27a. To this end, the drain electrode 29 and the first connection electrode 30a may be disposed so as to partially overlap the first semiconductor active layer 27a. In addition, the second connection electrode 30b and the source electrode 31 are electrically connected to the second semiconductor active layer 27b. To this end, the second connection electrode 30b and the source electrode 31 may be disposed so as to partially overlap the second semiconductor active layer 27b. Further, the first connection electrode 30a and the source electrode 31 are electrically connected to the third semiconductor active layer 27c. To this end, the first connection electrode 30a and the source electrode 31 may be disposed to partially overlap the third semiconductor active layer 27c. The second semiconductor active layer 27b is electrically connected to the source electrode 31 connected to the third semiconductor active layer 27c.

As such, the drain electrode 29 is electrically connected to the first semiconductor active layer 27a, and the first connection electrode 30a is electrically connected to the first and third semiconductor active layers 27a, 27b, 27c. In addition, the second connection electrode 30b is electrically connected to the third gate electrode 23c and the second semiconductor active layer 27b, and the source electrode 31 is electrically connected to the second and third semiconductor active layers 27b, 27c.

Here, the second connection electrode 30b may be electrically connected to the third gate electrode 23c through the first via-hole H1. Namely, the second connection electrode 30b may fill the first via-hole H1 to be electrically connected to the third gate electrode 23c exposed through the first via-hole H1.

As in the above exemplary embodiment, the drain electrode 29, the first connection electrode 30a, the second connection electrode 30b and the source electrode 31 may be formed using one electrode member. Thus, a detailed description thereof will be omitted. Here, the source electrode 31 may extend to the $V_{DD}$ line.

After the drain electrode 29, the first connection electrode 30a, the second connection electrode 30b and the source electrode 31 are formed, the second insulation layer 33 may be formed to cover the drain electrode 29, the first connection electrode 30a, the second connection electrode 30b, and the source electrode 31. The second insulation layer 33 may have the same or smaller size than the first insulation layer 25 and may include the same material as the first insulation layer 25.

Figure 18:
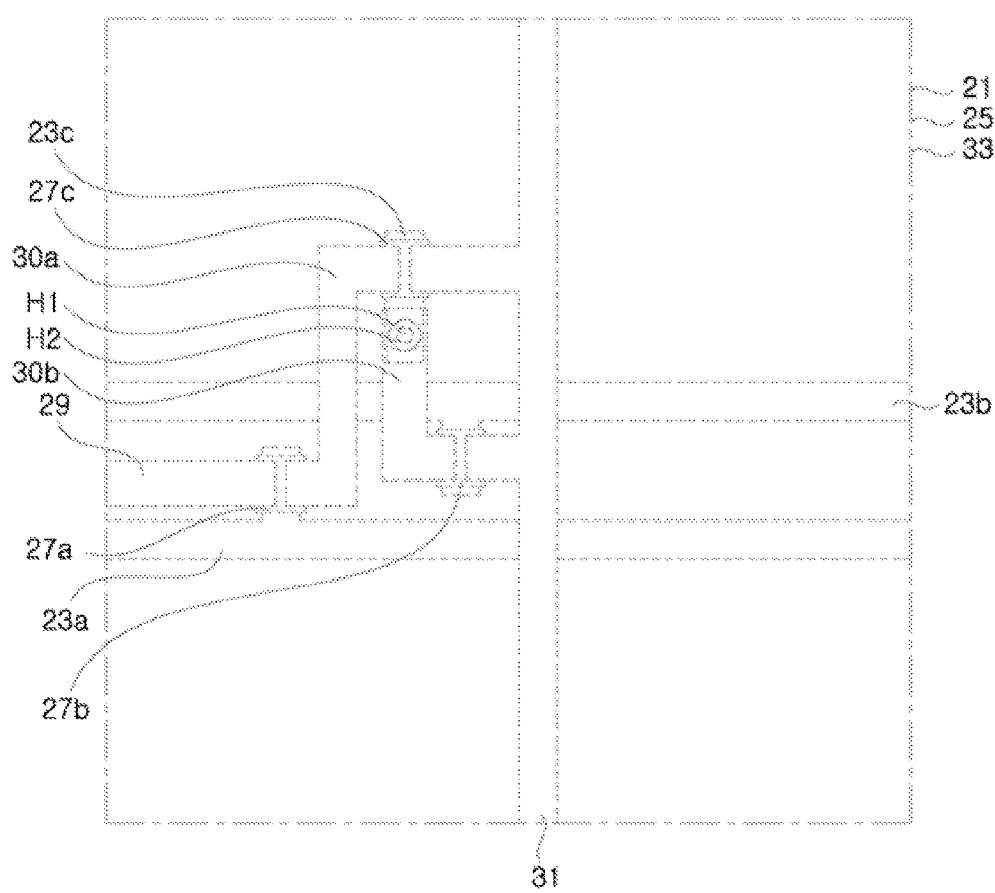

In addition, as shown in FIG. 18, the second insulation layer 33 may include a second via-hole H2. The second via-hole H2 may be disposed on the second connection electrode 30b and expose part of the second connection electrode 30b. Although the second via-hole H2 is illustrated as being formed above the first via-hole H1 in this exemplary embodiment, the second via-hole H2 may be formed at any location so long as the second connection electrode 30b can be partially exposed through the second via-hole H2.

Figure 19:
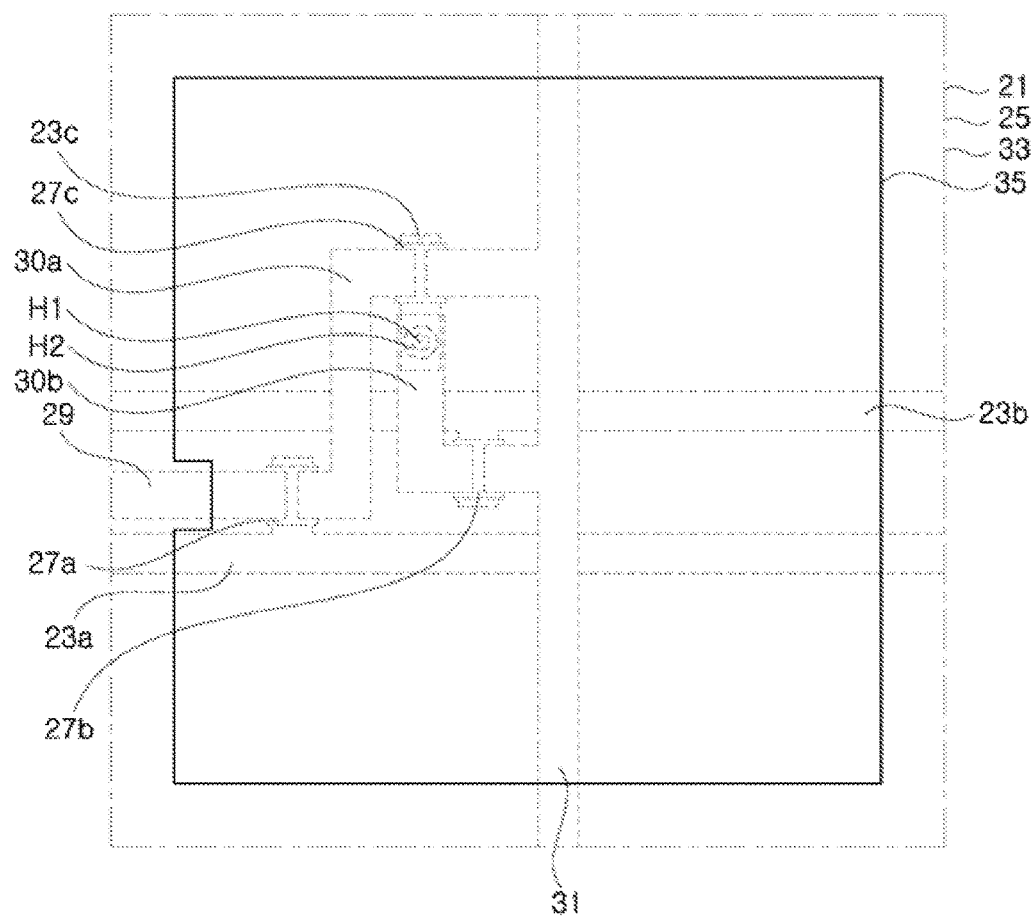

Referring to FIG. 19, the lower electrode 35 is formed on the second insulation layer 33 including the second via-hole H2. The lower electrode 35 is formed on the second insulation layer 33 while filling the second via-hole H2 and is electrically connected to the second connection electrode 30b through the second via-hole H2. As in the above embodiment, the lower electrode 35 may be formed with a groove at a location thereof corresponding to the drain electrode 29.

Further, the lower electrode 39 may be formed of at least one selected from the group consisting of Au, Ag, Al, Al—Nd, Al—Cu, Mo, Ti, Ta, Cr, and alloys thereof, and may be composed of a single layer or multiple layers.

Figure 20:
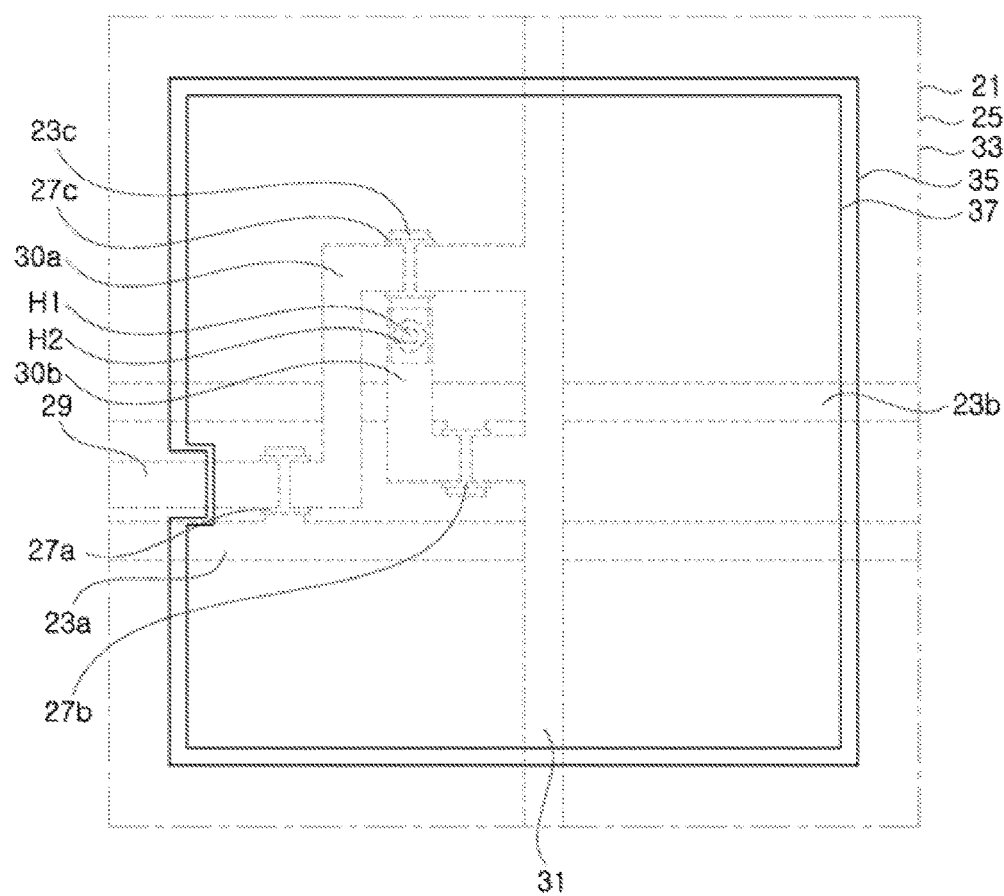

After the lower electrode 35 is formed, the photodiode 37 may be formed on the lower electrode 35, as shown in FIG. 20. The photodiode 37 may be formed to cover the entirety of the lower electrode 35. The photodiode 37 may have the same or smaller size than the lower electrode 35.

Figure 21:
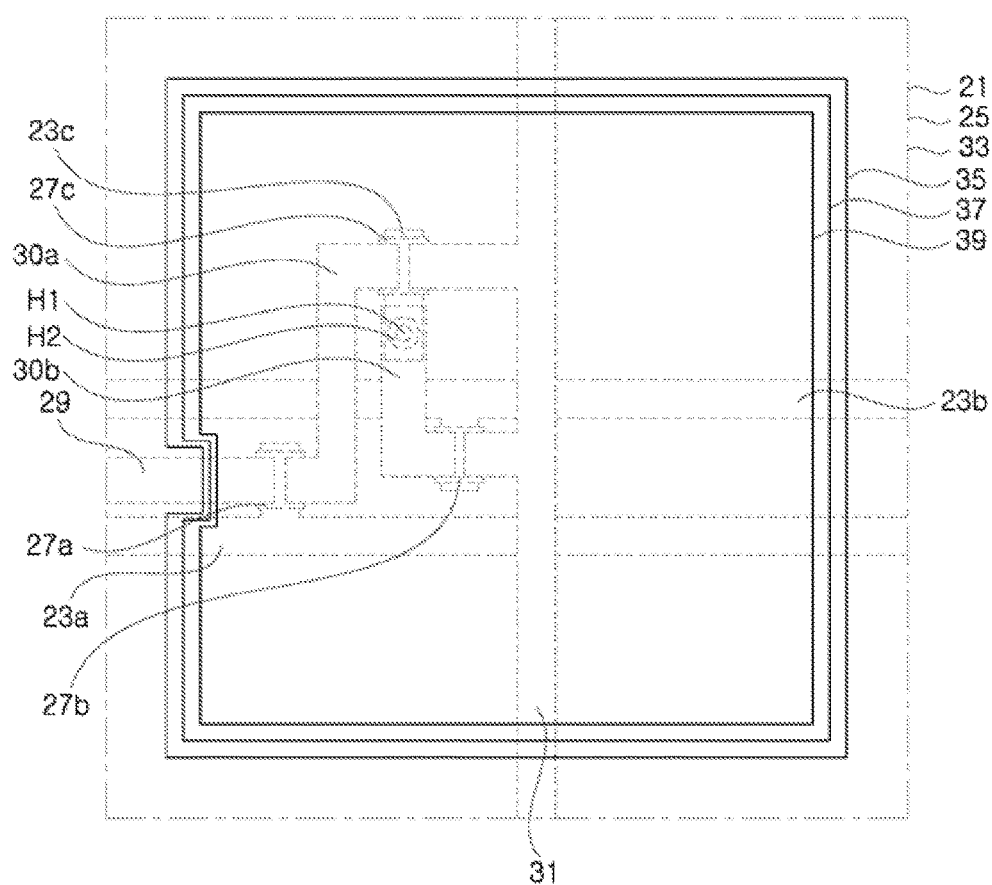

Referring to FIG. 21, the transparent electrode 39 is formed on the photodiode 37. The transparent electrode 39 may be smaller than the photodiode 37.

Further, each of the lower electrode 35 and the transparent electrode 39 may be formed through vacuum deposition, photolithography, wet etching, or dry etching.

Figure 22:
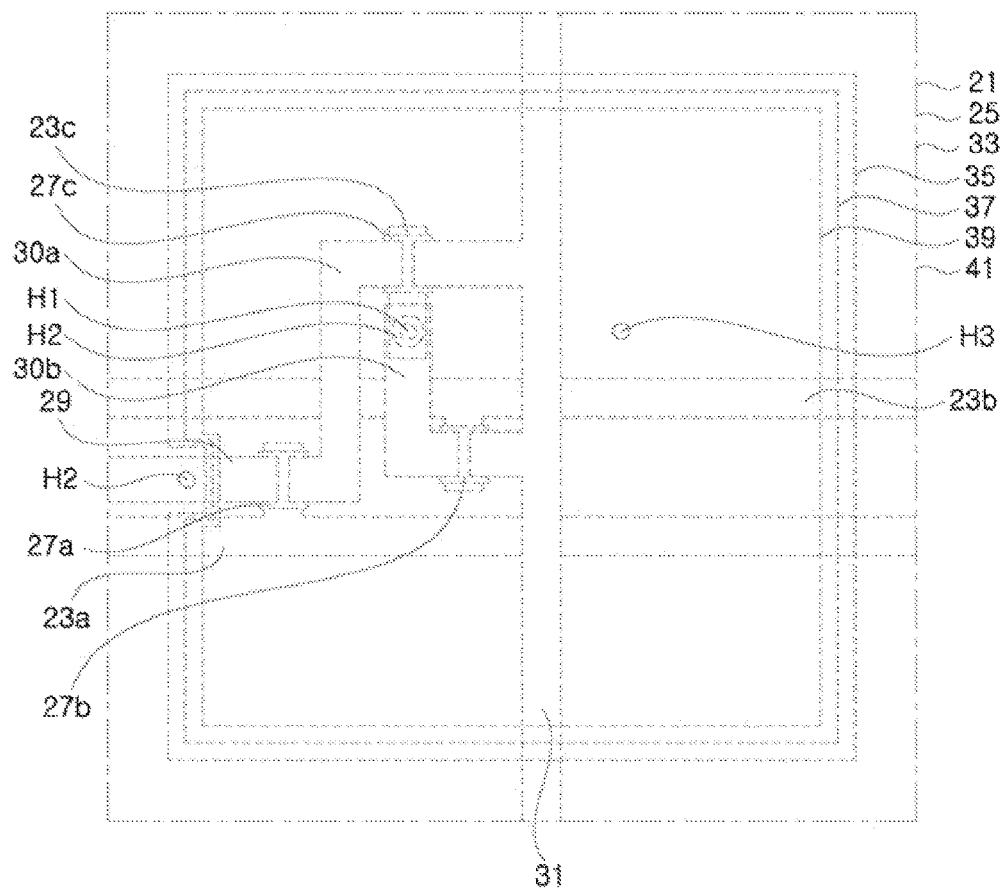

The third insulation layer 41 may be formed on the transparent electrode 39. The third insulation layer 41 may be formed to cover the entirety of the transparent electrode 39, or may be formed to cover the entirety of the substrate, as shown in FIG. 22. The third insulation layer 41 may include the same material as the other insulation layers.

After formation of the third insulation layer 41, third and fourth via-holes H3, H4 may be formed therein. The third via-hole H3 may be formed through the second and third insulation layers 33, 41 to expose part of the drain electrode 29 formed under the second insulation layer 33, and the fourth via-hole H4 may be formed through the third insulation layer 41 to expose part of the transparent electrode 39.

As shown in FIG. 22, the fourth via-hole H4 may be formed at a location separated from the source electrode 31 by a predetermined distance.

Figure 23:
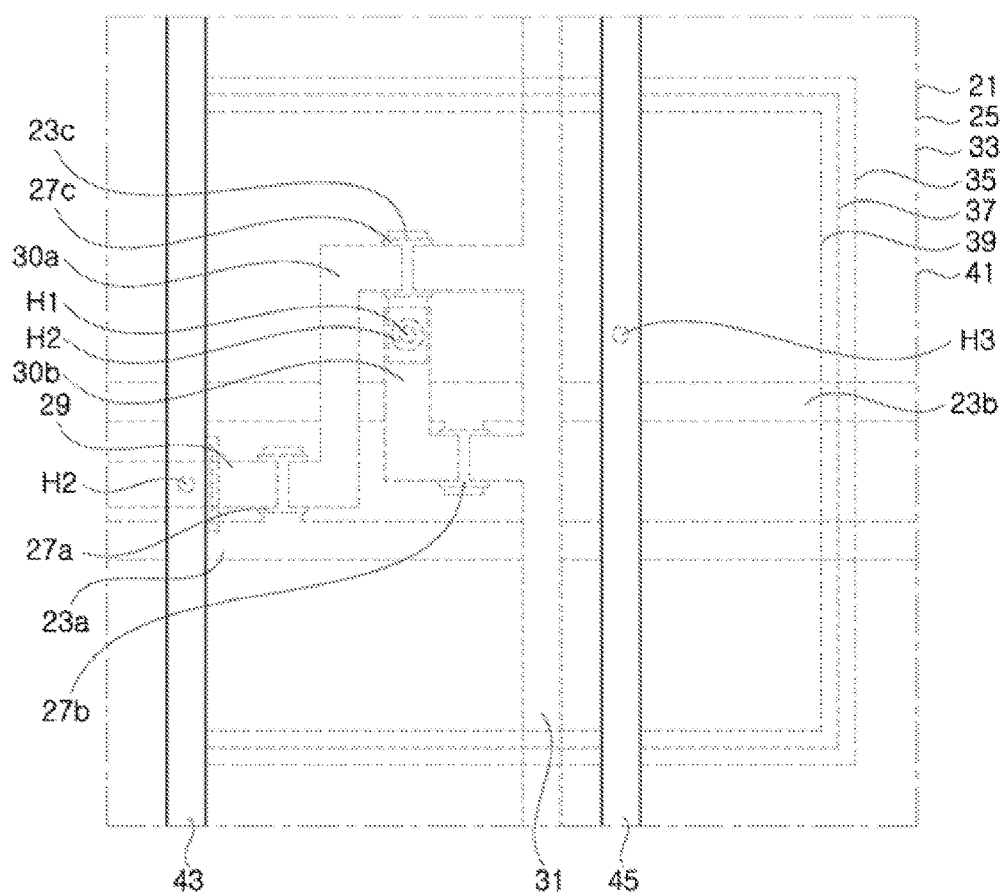

Referring to FIG. 23, the data line 43 may be formed at a location corresponding to the third via-hole H3 and the bias line 45 may be formed at a location corresponding to the fourth via-hole H4. Each of the data line 43 and the bias line 45 may be formed parallel to the $V_{DD}$ line of the source electrode 31.

The data line 43 may be formed to fill the third via-hole H3 at the location corresponding to the third via-hole H3, whereby the drain electrode 29 exposed through the third via-hole H3 can be electrically connected to the data line 43.

In addition, the bias line 45 may be formed to fill the fourth via-hole H4 at the location corresponding to the fourth via-hole H4, whereby the transparent electrode 39 exposed through the fourth via-hole H4 can be electrically connected to the bias line 45.

Figure 24:
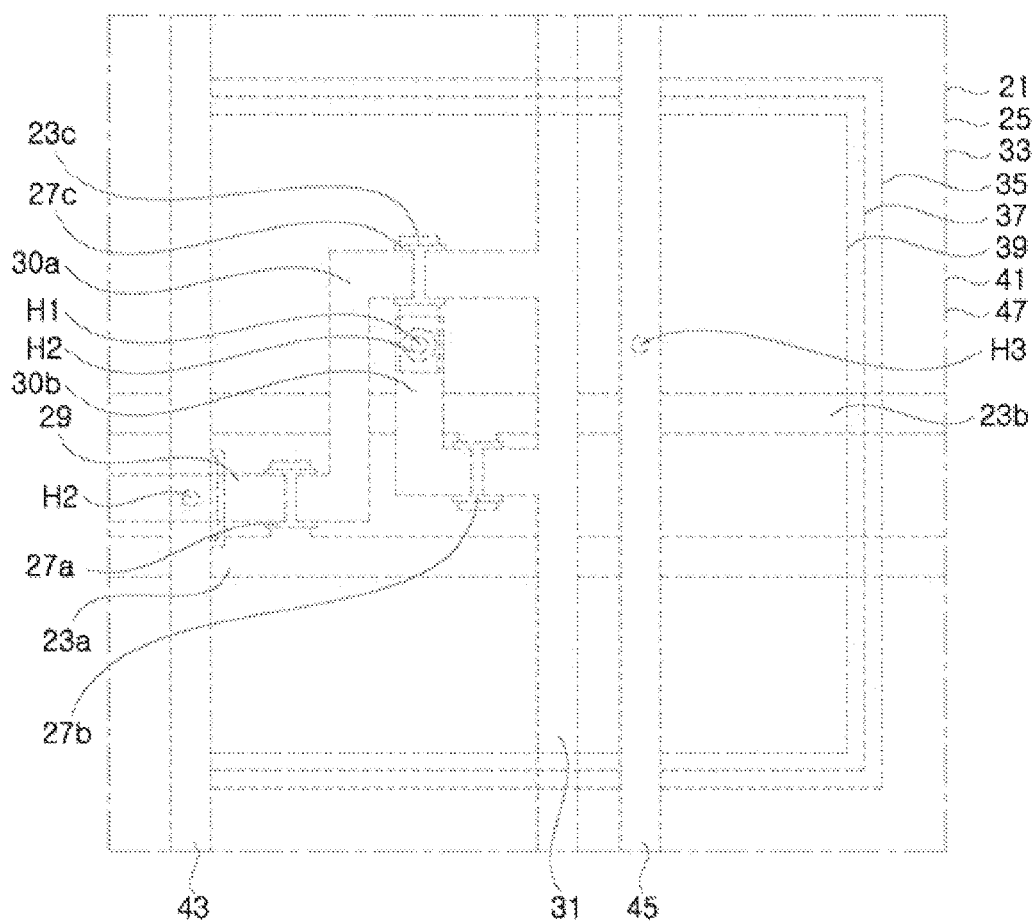

After formation of the data line 43 and the bias line 45, the protective layer 47 is formed on the data line 43 and the bias line 45 so as to cover the data line 43 and the bias line 45. Alternatively, as shown in FIG. 24, the protective layer 47 may be formed to cover the entirety of the substrate 21 as well as the data line 43 and the bias line 45. The protective layer 47 may include the same material as the first to third insulation layers 25, 33, 41.

Figure 25:
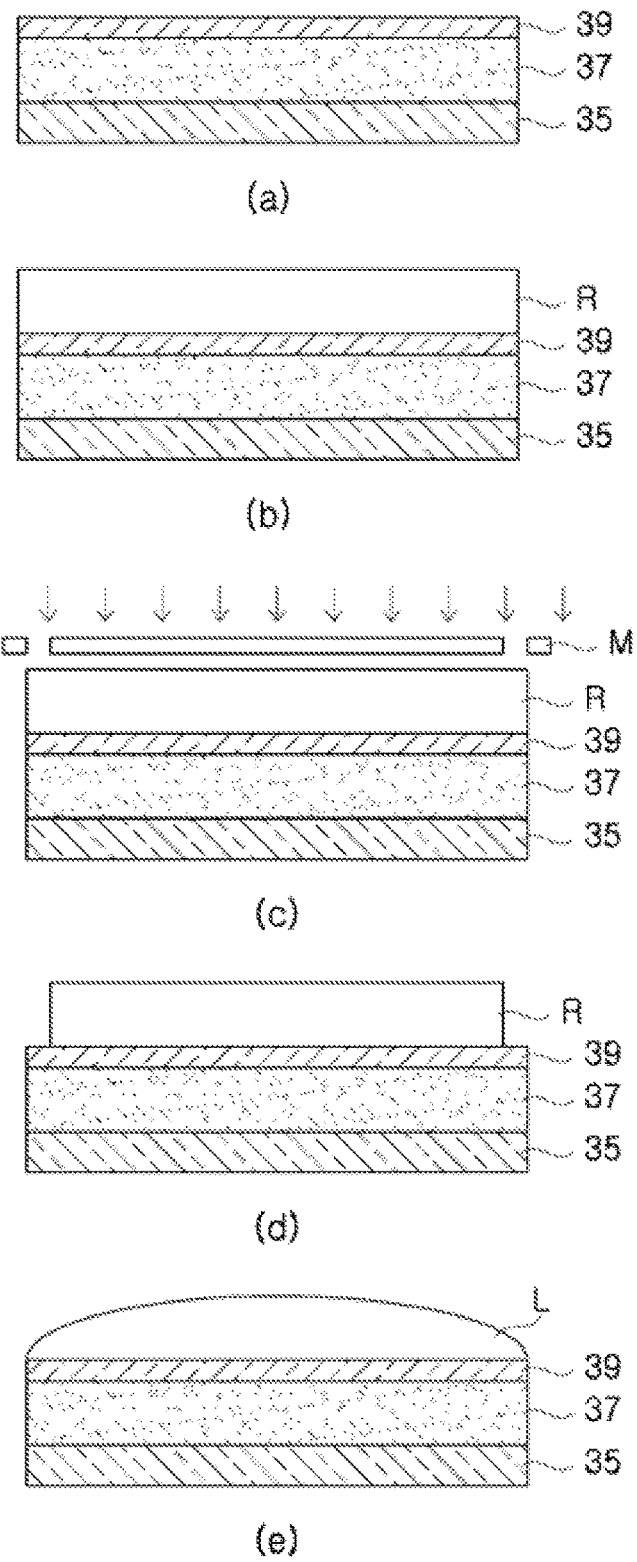
FIG. 25 shows sectional views illustrating a method of forming a lens on a photodiode according to one exemplary embodiment of the present disclosure.

FIG. 25 shows sectional views illustrating a method of forming a lens on a photodiode according to one exemplary embodiment of the present disclosure.

In this way, the active pixel sensor 100 according to the exemplary embodiments can be manufactured. As described above, the photodiode 37 of the active pixel sensor according to the exemplary embodiments receives visible light converted from X-rays. Thus, a microlens L may be formed on the photodiode 37 in order to improve efficiency of photo electrons entering the photodiode 37. A process of forming the microlens L on the photodiode is shown in FIG. 25 and the microlens L formed on the photodiode 37 has a shape as shown in FIG. 25 (e).

The photodiode 37 is disposed as shown in FIG. 25 (a). Here, the lower electrode 35 is disposed on a lower surface of the photodiode 37 and the transparent electrode 39 is disposed on an upper surface thereof. Then, as shown in FIG. 25 (b), a resin R is deposited to a predetermined thickness on the transparent electrode 35. The resin R may include benzocyclobutene (BCB), polydimethylsiloxane (PDMS), SU-8/2, photoresist, poly methyl methacrylate (PMMA), organic resins, and the like. The resin R may be deposited onto the transparent electrode 35 by spin coating, extrusion or ink-jet printing and may have a thickness of 1 μm to 10 μm.

Then, the resin R is cured by baking heat treatment at 80° C. to 200° C. on a hot plate or in a convection oven, in a vacuum oven, or in a heat treatment oven under a nitrogen atmosphere.

Then, as shown in FIG. 25 (c), with a photomask M placed on the cured resin R subjected to heat treatment, shape patterning is performed on the resin R through irradiation with UV light so as to remove the periphery of the resin R, as shown in FIG. 25 (d). Removal of the periphery of the resin R is performed in order to shape the resin R into the microlens L through reflow. In this exemplary embodiment, the periphery of the R to be removed may have a width of about 0.5 μm to 5 μm.

Then, the photodiode 37 having the resin R formed thereon is subjected to heat treatment at about 80° C. to 250° C., thereby forming the microlens L having a substantially semi-spherical shape through a space, from which the resin R is removed, as shown in FIG. 25 (e).

Although some exemplary embodiments have been described herein, it should be understood by those skilled in the art that these embodiments are given by way of illustration only, and that various modifications, variations, and alterations can be made without departing from the spirit and scope of the present disclosure. Therefore, the scope of the present disclosure should be limited only by the accompanying claims and equivalents thereof.

LIST OF REFERENCE NUMERALS

100: active pixel sensor
21: substrate
23a: first gate electrode
23b: second gate electrode
23c: third gate electrode
25: first insulation layer
27a: first semiconductor active layer 27b: second semiconductor active layer
27c: third semiconductor active layer
29: drain electrode
30: connection electrode
30a: first connection electrode
30b: second connection electrode
31: source electrode
33: second insulation layer
35: lower electrode
37: photodiode
39: transparent electrode
41: third insulation layer
43: data line
45: bias line
47: protective layer
H1~H4: first to fourth via-holes
R: resin
L: microlens
TFT1~TFT3: first to third thin-film transistors

What is claimed is:

1. An X-ray detection panel for X-ray detectors, comprising:
    a substrate;
    a photodiode disposed on the substrate and generating an electrical signal in response to light illuminating the photodiode;
    a first thin-film transistor disposed on the substrate and processing the electrical signal generated by the photodiode; and
    a second thin-film transistor disposed on the substrate and removing a residual current component accumulated in the photodiode and the first thin-film transistor;
    a gate line, a gate reset line and a data line disposed on the substrate, wherein each of the first and second thin-film transistors is electrically connected to at least one of the gate line, the gate reset line and the data line; wherein the first thin-film transistor comprises a gate electrode, a source electrode, and a drain electrode, the drain electrode of the first thin-film transistor being connected to the data line, and the gate electrode of the first thin-film transistor being connected to the gate line.

2. The X-ray detection panel for X-ray detectors according to claim 1, wherein the second thin-film transistor comprises a gate electrode, a source electrode, and a drain electrode,
    the gate electrode of the second thin-film transistor being connected to the gate reset line.

3. The X-ray detection panel for X-ray detectors according to claim 1, further comprising:
    a bias line,
    wherein the photodiode is connected at one side thereof to the source electrode of the first thin-film transistor and at the other side thereof to the bias line.

4. The X-ray detection panel for X-ray detectors according to claim 1, wherein each of the first and second thin-film transistors comprises a gate electrode, a source electrode and a drain electrode, and the source electrode of the first thin-film transistor is connected to the drain electrode of the second thin-film transistor and the photodiode.

5. The X-ray detection panel for X-ray detectors according to claim 1, wherein the second thin-film transistor comprises a gate electrode, a source electrode and a drain electrode, and the source electrode of the second thin-film transistor is connected to a $V_{DD}$ line.

6. The X-ray detection panel for X-ray detectors according to claim 1, further comprising:
    a third thin-film transistor amplifying an output of the photodiode.

7. The X-ray detection panel for X-ray detectors according to claim 6, further comprising:
    a gate line, a gate reset line, and a data line disposed on the substrate,
    wherein the third thin-film transistor is electrically connected to at least one of the gate line, the gate reset line and the data line.

8. The X-ray detection panel for X-ray detectors according to claim 7, wherein each of the first and third thin-film transistors comprises a gate electrode, a source electrode and a drain electrode, and the gate electrode of the third thin-film transistor is connected to one side of the photodiode and the source electrode of the first thin-film transistor.

9. The X-ray detection panel for X-ray detectors according to claim 8, wherein the second thin-film transistor comprises a gate electrode, a source electrode and a drain electrode,
    the drain electrode of the third thin-film transistor is connected to the source electrode of the first thin-film transistor, and
    the source electrode of the third thin-film transistor is connected to a drain terminal of the second thin-film transistor and a $V_{DD}$ line.

10. The X-ray detection panel for X-ray detectors according to claim 1, wherein the photodiode further comprises a microlens formed on the photodiode.

11. The X-ray detection panel for X-ray detectors according to claim 10, further comprising:
    a transparent electrode formed on the photodiode,
    wherein the microlens is disposed on the transparent electrode.

12. The X-ray detection panel for X-ray detectors according to claim 11, further comprising:
    a lower electrode disposed under the photodiode and electrically connected to at least one of the first and second thin-film transistors.

* * * * *